United States Patent
Banine et al.

(10) Patent No.: US 9,411,250 B2
(45) Date of Patent: Aug. 9, 2016

(54) RADIATION SYSTEM AND LITHOGRAPHIC APPARATUS

(75) Inventors: Vadim Yevgenyevich Banine, Deurne (NL); Erik Roelof Loopstra, Eindhoven (NL); Vladimir Vitalevich Ivanov, Moscow (RU); Vladimir Mihailovitch Krivtsun, Moscow Reg. (RU)

(73) Assignee: ASML NETHERLANDS B.V., Veldhoven (NL)

( * ) Notice: Subject to any disclaimer, the term of this patent is extended or adjusted under 35 U.S.C. 154(b) by 1168 days.

(21) Appl. No.: 13/062,872

(22) PCT Filed: Apr. 30, 2009

(86) PCT No.: PCT/EP2009/003135
§ 371 (c)(1),
(2), (4) Date: Mar. 8, 2011

(87) PCT Pub. No.: WO2010/028704
PCT Pub. Date: Mar. 18, 2010

(65) Prior Publication Data
US 2011/0170079 A1    Jul. 14, 2011

Related U.S. Application Data

(60) Provisional application No. 61/136,494, filed on Sep. 9, 2008, provisional application No. 61/136,833, filed on Oct. 7, 2008.

(51) Int. Cl.
*G03F 7/20* (2006.01)
*H05G 2/00* (2006.01)

(52) U.S. Cl.
CPC ........ *G03F 7/70916* (2013.01); *G03F 7/70175* (2013.01); *G03F 7/70858* (2013.01); *G03F 7/70983* (2013.01); *H05G 2/003* (2013.01); *H05G 2/005* (2013.01)

(58) Field of Classification Search
CPC ....... H05G 2/003; H05G 2/008; H05G 2/005; H05G 2/006; H05G 2/00; H05G 2/001; G03F 7/70916; G03F 7/70033; G03F 7/70175; G03F 7/702; G03F 7/70908; G03F 7/2004; G03F 7/70008; H01S 3/1066
USPC .................... 355/30, 53, 67, 69, 77
See application file for complete search history.

(56) References Cited

U.S. PATENT DOCUMENTS

| 6,987,279 B2 | 1/2006 | Hoshino et al. |
| 7,087,914 B2 | 8/2006 | Akins et al. |

(Continued)

FOREIGN PATENT DOCUMENTS

| JP | 2552433 | 11/1996 |
| JP | 2004-207736 | 7/2004 |

(Continued)

OTHER PUBLICATIONS

English translation of Japanese Office Action mailed Sep. 13, 2013 in corresponding Japanese Patent Application No. 2011-525418.

(Continued)

*Primary Examiner* — Mesfin T Asfaw
(74) *Attorney, Agent, or Firm* — Pillsbury Winthrop Shaw Pittman LLP

(57) ABSTRACT

A radiation system is configured to generate a radiation beam. The radiation system includes a radiation source configured to generate a plasma that emits radiation and debris, and a radiation collector configured to direct collected radiation to a radiation beam emission aperture. A magnetic field generator is configured to generate a magnetic field with a gradient in magnetic field strength to direct the plasma away from the radiation collector.

41 Claims, 7 Drawing Sheets

(56) References Cited

U.S. PATENT DOCUMENTS

| | | |
|---|---|---|
| 7,136,141 B2 | 11/2006 | Bakker |
| 7,251,012 B2 | 7/2007 | Banine et al. |
| 7,323,821 B2 | 1/2008 | Schwarzl et al. |
| 7,619,233 B2 | 11/2009 | Fujimoto |
| 7,642,533 B2 | 1/2010 | Partio et al. |
| 8,071,963 B2 | 12/2011 | Van Herpen et al. |
| 2005/0140945 A1 | 6/2005 | Banine et al. |
| 2005/0155624 A1* | 7/2005 | Lee et al. ............ 134/1.1 |
| 2005/0167618 A1 | 8/2005 | Hoshino et al. |
| 2006/0132046 A1 | 6/2006 | Schwarzl et al. |
| 2007/0145297 A1* | 6/2007 | Freriks et al. ............ 250/492.2 |
| 2007/0158594 A1* | 7/2007 | Shirai et al. ............ 250/504 R |
| 2007/0228303 A1 | 10/2007 | Fujimoto |
| 2008/0017810 A1* | 1/2008 | Frijns ............ 250/492.2 |

FOREIGN PATENT DOCUMENTS

| | | |
|---|---|---|
| JP | 2005-197456 | 7/2005 |
| JP | 2005-522839 | 7/2005 |
| JP | 2006-526281 | 11/2006 |
| JP | 2007-522646 | 8/2007 |
| JP | 2007-273749 | 10/2007 |
| JP | 2007-529869 | 10/2007 |
| JP | 2008-16753 | 1/2008 |
| JP | 2008-166772 | 7/2008 |

OTHER PUBLICATIONS

International Search Report for PCT International Patent Application No. PCT/EP2009/003135, mailed Jul. 24, 2009.

Chinese Office Action dated Dec. 21, 2012 in corresponding Chinese Patent Application No. 200980134829.8.

Chinese Office Action issued May 5, 2016 in corresponding Chinese Patent Application No. 201510142259.4.

* cited by examiner

RADIATION SYSTEM AND LITHOGRAPHIC APPARATUS

CROSS-REFERENCE TO RELATED APPLICATIONS

This application is the U.S. national phase entry of PCT/EP2009/003135, filed Apr. 30, 2009, which claims the benefit of priority from U.S. Provisional Patent Application No. 61/136,494, filed Sep. 9, 2008, and U.S. Provisional Patent Application No. 61/136,833, filed Oct. 7, 2008, the contents of both of which are incorporated herein by reference in their entireties.

FIELD

The present invention relates to a radiation system and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned.

Lithography is widely recognized as one of the key steps in the manufacture of ICs and other devices and/or structures. However, as the dimensions of features made using lithography become smaller, lithography is becoming a more critical factor for enabling miniature IC or other devices and/or structures to be manufactured.

A theoretical estimate of the limits of pattern printing can be given by the Rayleigh criterion for resolution as shown in equation (1):

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from equation (1) that reduction of the minimum printable size of features can be obtained in three ways: by shortening the exposure wavelength $\lambda$, by increasing the numerical aperture $NA_{PS}$ or by decreasing the value of $k_1$.

In order to shorten the exposure wavelength and, thus, reduce the minimum printable size, it has been proposed to use an extreme ultraviolet (EUV) radiation source. EUV radiation sources are configured to output a radiation wavelength of about 13 nm. Thus, EUV radiation sources may constitute a significant step toward achieving small features printing. Such radiation is termed extreme ultraviolet or soft x-ray, and possible sources include, for example, laser-produced plasma sources, discharge plasma sources, or synchrotron radiation from electron storage rings.

The current EUV sources use mechanical devices and either gas or magnetic field in order to terminate plasma, neutral and ionic debris. The suppression of debris, especially in a laser produced plasma (LPP) source is currently insufficient (up to 10 nm/Mshot tin deposition).

SUMMARY

It is desirable to provide an improved radiation system for a lithographic apparatus. It is also desirable to provide a radiation system for a lithographic apparatus that can reduce the amount of debris that collects on a collector of the radiation system.

According to an embodiment of the present invention, there is provided a radiation system configured to generate a radiation beam, the radiation system comprising: a radiation source configured to generate a plasma that emits radiation and debris; a radiation collector to direct collected radiation to a radiation beam emission aperture; and a magnetic field generator configured to generate a magnetic field with a gradient in magnetic field strength to direct the plasma away from the radiation collector.

According to an embodiment of the present invention, there is provided a method for suppressing debris in a radiation system, the radiation system comprising a radiation source and a radiation collector, the method comprising: generating a plasma that emits radiation and debris; collecting the radiation using the radiation collector; and generating a magnetic field gradient within the radiation system to direct the plasma away from the radiation collector.

According to an embodiment of the present invention, there is provided a lithographic apparatus comprising: a radiation system configured to generate a radiation beam, the radiation system comprising: a radiation source configured to generate a plasma that emits radiation and debris, a radiation collector to direct collected radiation to a radiation beam emission aperture, a magnetic field generator configured to generate a magnetic field gradient to direct the plasma away from the radiation collector; an illumination system constructed and arranged to receive the collected radiation from the radiation beam emission aperture and to condition the collected radiation into a radiation beam; a support constructed and arranged to support a patterning device, the patterning device being configured to impart a pattern to a cross-section of the radiation beam to form a patterned radiation beam; and a projection system constructed and arranged to project the patterned radiation beam onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
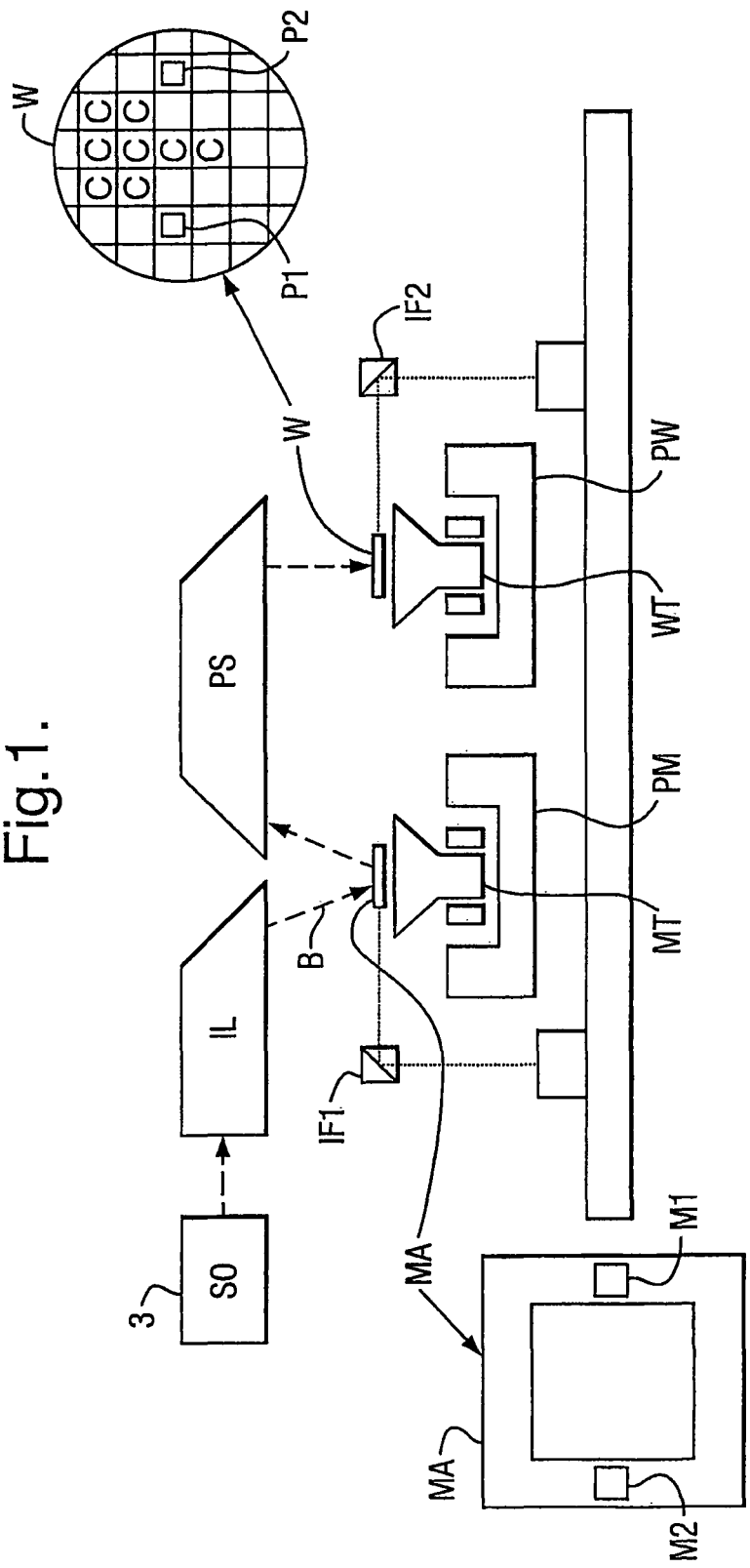
FIG. 1 depicts a lithographic apparatus in accordance with an embodiment of the invention.

FIG. 1 schematically depicts an embodiment of a lithographic apparatus, that can be or include an embodiment of the invention. The apparatus includes an illumination system (illuminator) IL configured to condition a radiation beam B (e.g. EUV radiation); a support structure or patterning device support (e.g. a mask table) MT constructed to support a patterning device (e.g. a mask or a reticle) MA and connected to a first positioner PM configured to accurately position the patterning device; a substrate table (e.g. a wafer table) WT constructed to hold a substrate (e.g. a resist-coated wafer) W and connected to a second positioner PW configured to accurately position the substrate; and a projection system (e.g. a reflective projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device MA in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system.

The term "patterning device" should be broadly interpreted as referring to any device that can be used to impart a radiation beam with a pattern in its cross-section such as to create a pattern in a target portion of the substrate. The pattern imparted to the radiation beam may correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" may encompass any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. It may be desired to use a vacuum for EUV or electron beam radiation since other gases may absorb too much radiation or electrons. A vacuum environment may therefore be provided to the whole beam path with the aid of a vacuum wall and vacuum pumps.

As here depicted, the apparatus is of a reflective type (e.g. employing a reflective mask). Alternatively, the apparatus may be of a transmissive type (e.g. employing a transmissive mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source SO may be part of a radiation system 3 (i.e. radiation generating unit 3). The radiation system 3 and the lithographic apparatus may be separate entities. In such cases, the radiation system 3 is not considered to form part of the lithographic apparatus and the radiation beam is passed from the source SO of radiation system 3 to the illuminator IL with the aid of a beam delivery system including, for example, suitable directing mirrors and/or a beam expander. In other cases, the source may be an integral part of the lithographic apparatus The source SO of the radiation system 3 may be configured in various ways. For example, the source SO may be a laser produced plasma source (LPP source), for example a Tin LPP source (such LPP sources are known per se) or a discharge-produced plasma source (DPP source). The source SO may also be a different type of radiation source.

The illuminator IL may include an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator and a condenser. The illuminator may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. After being reflected from the patterning device (e.g. mask) MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device (e.g. mask) MA with respect to the path of the radiation beam B. Patterning device (e.g. mask) MA and substrate W may be aligned using mask alignment marks M1, M2 and substrate alignment marks P1, P2.

The depicted apparatus could be used in at least one of the following modes:

1. In step mode, the support structure (e.g. mask table) MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed.

2. In scan mode, the support structure (e.g. mask table) MT and the substrate table WT are scanned synchronously while a pattern imparted to the radiation beam is projected onto a target portion C (i.e. a single dynamic exposure). The velocity and direction of the substrate table WT relative to the support structure (e.g. mask table) MT may be determined by the (de-)magnification and image reversal characteristics of the projection system PS.

3. In another mode, the support structure (e.g. mask table) MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
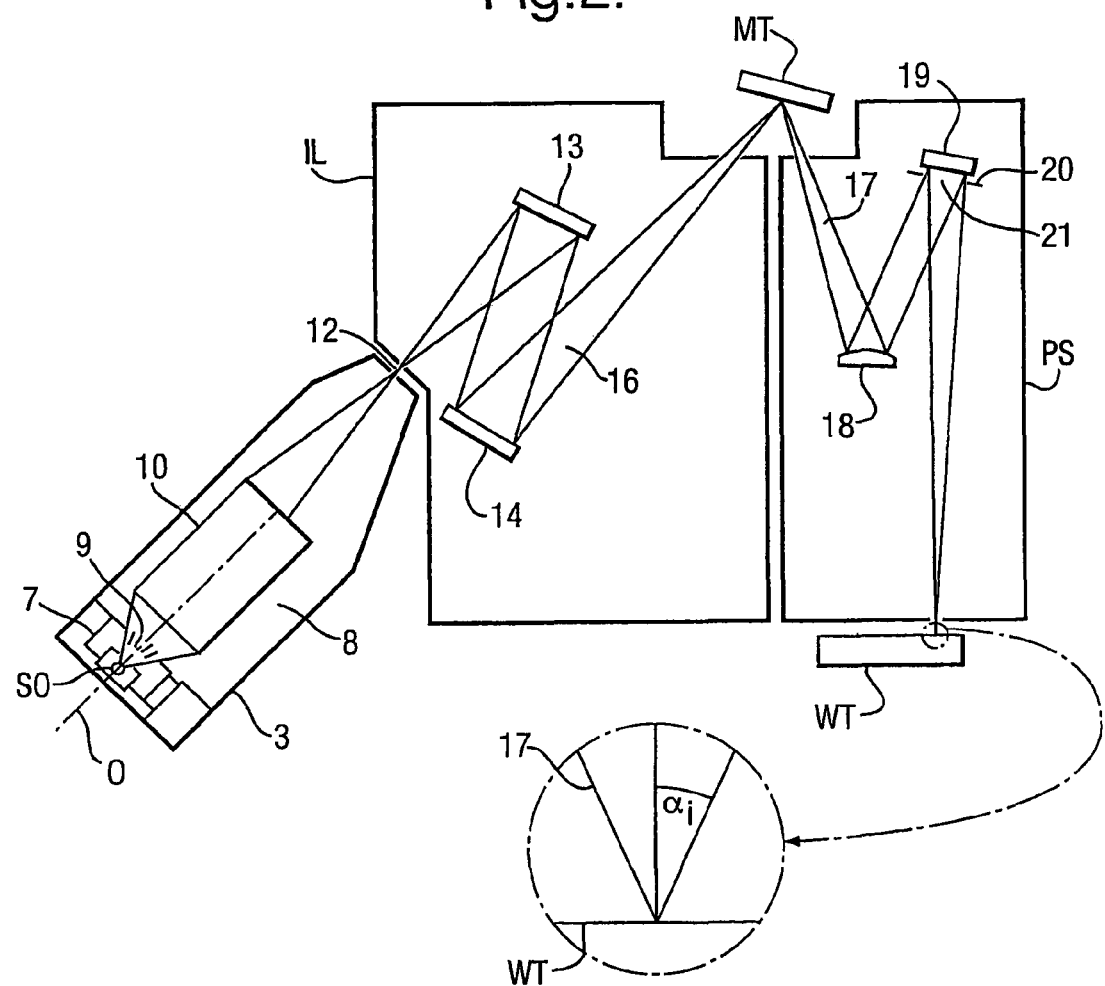
FIG. 2 depicts a lithographic apparatus in accordance with an embodiment of the invention.

FIG. 2 schematically shows a further embodiment of an EUV lithographic apparatus, having a principle of operation that is similar to the operation of the apparatus shown in the embodiment of FIG. 1. In the embodiment of FIG. 2, the apparatus includes a source-collector-module or radiation unit 3 (also referred to herein as a radiation system), an illumination system IL and a projection system PS. According to an embodiment, radiation unit 3 is provided with a radiation source SO, preferably a laser produced plasma ("LPP") source. In the present embodiment, the radiation emitted by radiation source SO may be passed from the source chamber 7 into a chamber 8 via a gas barrier or "foil trap" 9. In FIG. 2, the chamber 8 includes a radiation collector 10.

FIG. 2 depicts the application of a grazing incidence collector 10. However, the collector may be a normal incidence collector, particularly in the case the source is a LPP source.

The radiation may be focused in a virtual source point 12 (i.e. an intermediate focus IF) from an aperture in the chamber 8. From chamber 8, the radiation beam 16 is reflected in illumination system IL via normal incidence reflectors 13,14 onto a patterning device (e.g. reticle or mask) positioned on support structure or patterning device support (e.g. reticle or mask table) MT. A patterned beam 17 is formed which is imaged by projection system PS via reflective elements 18,19 onto wafer stage or substrate table WT. More elements than shown may generally be present in the illumination system IL and projection system PS.

One of the reflective elements 19 may have in front of it a numerical aperture (NA) disc 20 having an aperture 21 therethrough. The size of the aperture 21 determines the angle $\alpha_i$ subtended by the patterned radiation beam 17 as it strikes the substrate table WT.

In other embodiments, the radiation collector is one or more of a collector configured to focus collected radiation into the radiation beam emission aperture; a collector having a first focal point that coincides with the source and a second focal point that coincides with the radiation beam emission aperture; a normal incidence collector; a collector having a single substantially ellipsoid radiation collecting surface section; and a Schwarzschild collector having two radiation collecting surfaces.

Also, in another embodiment, the radiation source SO may be a laser produced plasma (LPP) source including a light source that is configured to focus a beam of coherent light, of a predetermined wavelength, onto a fuel.

Figure 3:
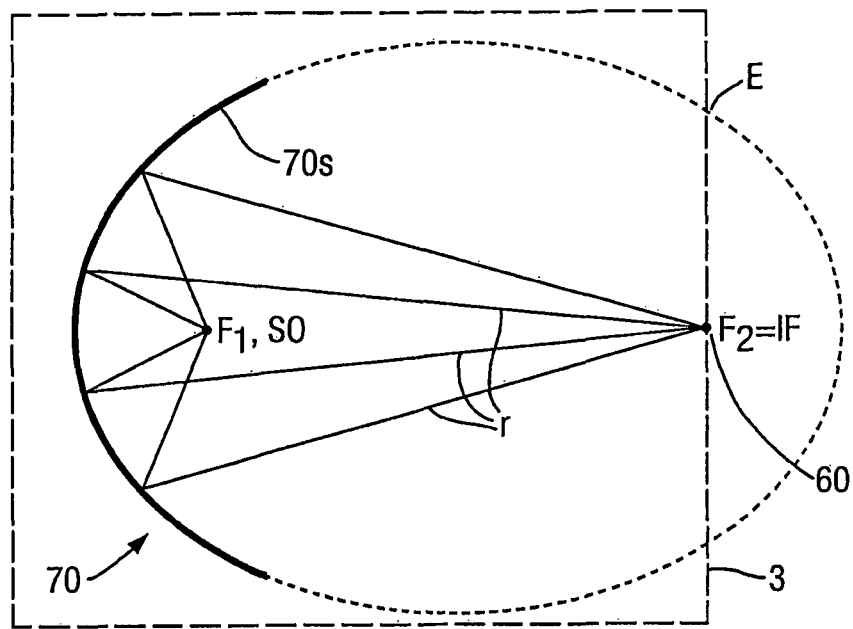
FIG. 3 depicts a radiation source and a normal incidence collector in accordance with an embodiment of the invention.

For example, FIG. 3 shows an embodiment of a radiation source unit 3, in cross-section, including a normal incidence collector 70. The collector 70 has an elliptical configuration, having two natural ellipse focus points F1, F2. Particularly, the normal incidence collector includes a collector having a single radiation collecting surface 70s having the geometry of the section of an ellipsoid. In other words: the ellipsoid radiation collecting surface section extends along a virtual ellipsoid (part of which is depicted by as dotted line E in the drawing).

As will be appreciated by the skilled person, in case the collector mirror 70 is ellipsoidal (i.e., including a reflection surface 70s that extends along an ellipsoid), it focuses radiation from one focal point F1 into another focal point F2. The focal points are located on the long axis of the ellipsoid at a distance $f=(a^2-b^2)^{1/2}$ from the center of the ellipse, where 2a and 2b are the lengths of the major and minor axes, respectively. In case that the embodiment shown in FIG. 1 includes an LPP radiation source SO, the collector may be a single ellipsoidal mirror as shown in FIG. 3, where the light source SO is positioned in one focal point (F1) and an intermediate focus IF is established in the other focal point (F2) of the mirror. Radiation emanating from the radiation source, located in the first focal point (F1) towards the reflecting surface 70s and the reflected radiation, reflected by that surface towards the second focus point F2, is depicted by lines r in the drawing. For example, according to an embodiment, a mentioned intermediate focus IF may be located between the collector and an illumination system IL (see FIGS. 1, 2) of a lithographic apparatus, or be located in the illumination system IL, if desired.

Figure 4:
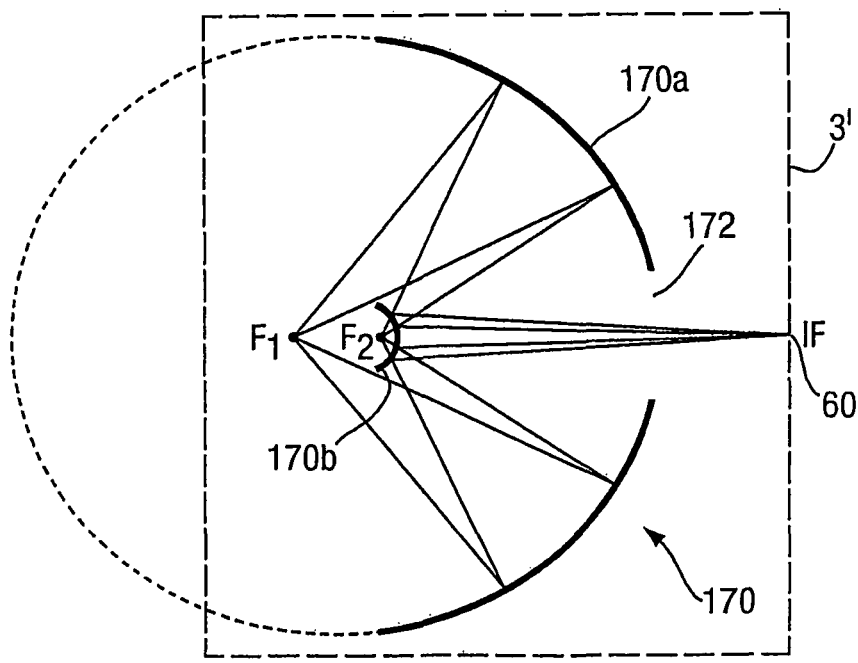
FIG. 4 depicts a radiation source and a Schwarzschild type normal incidence collector in accordance with an embodiment of the invention.

FIG. 4 schematically shows a radiation source unit 3' in accordance with an embodiment of the invention, in cross-section, including a collector 170. In this case, the collector includes two normal incidence collector parts 170a, 170b, each part 170a, 170b preferably (but not necessarily) having a substantially ellipsoid radiation collecting surface section. Particularly, the embodiment of FIG. 4 includes a Schwarzschild collector design, preferably consisting of two mirrors 170a, 170b. The source SO may be located in a first focal point F1. For example, the first collector mirror part 170a may have a concave reflecting surface (for example of ellipsoid or parabolic shape) that is configured to focus radiation emanating from the first focal point F1 towards the second collector mirror part 170b, particularly towards a second focus point F2. The second mirror part 170b may be configured to focus the radiation that is directed by the first mirror part 170a towards the second focus point F2, towards a further focus point IF (for example an intermediate focus). The first mirror part 170a includes an aperture 172 via which the radiation (reflected by the second mirror 170b) may be transmitted towards the further focus point IF. For example, the embodiment of FIG. 4 may beneficially be used in combination with a DPP radiation source.

Figure 5:
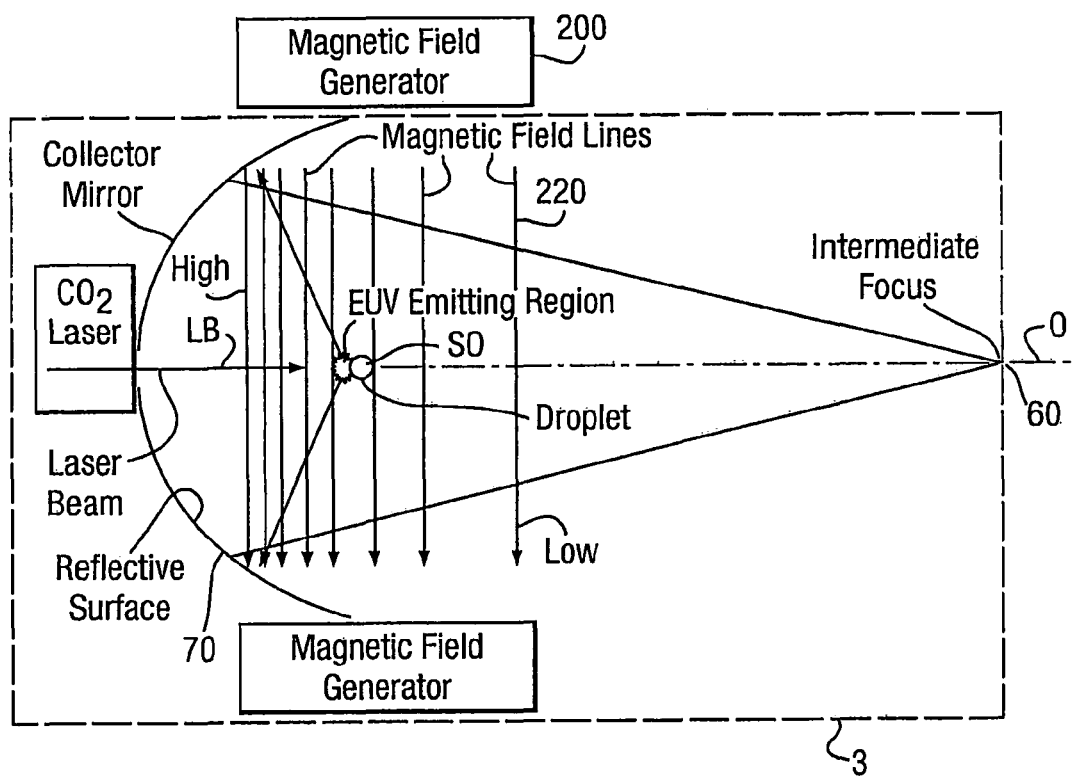
FIG. 5 depicts a radiation source and a normal incidence collector in accordance with an embodiment of the invention.

As is illustrated in FIG. 5, in the present embodiment, the source SO is a LPP source, that is associated with a laser source configured to generate a laser beam of coherent light, having a predetermined wavelength. The laser light LB is focused onto a fuel source SO (the fuel for example being supplied by a fuel supplier, and for example including fuel droplets, for example tin droplets) to generate radiation therefrom, in a laser produced plasma process. The resulting radiation may be EUV radiation, in this embodiment. In a non-limiting embodiment, the predetermined wavelength of the laser light is 10.6 microns (i.e. µm). For example, the fuel may be tin (Sn), or a different type of fuel, as will be appreciated by the skilled person.

The radiation collector 70 may be configured to collect radiation generated by the source SO, and to focus collected radiation to the downstream radiation beam emission aperture 60 of the chamber 3.

For example, the source SO may be configured to emit diverging radiation, and the collector 70 may be arranged to reflect that diverging radiation to provide a converging radiation beam, converging towards the emission aperture 60 (as in FIGS. 3 and 4). Particularly, the collector 70 may focus the radiation onto a focal point IF on an optical axis O of the system (see FIG. 2), which focal point IF is located in the emission aperture 60.

The emission aperture 60 may be a circular aperture, or have another shape (for example elliptical, square, or another shape). The emission aperture 60 is preferably small, for example having a diameter less than about 10 cm, preferably less than 1 cm, (measured in a direction transversally with a radiation transmission direction T, for example in a radial direction in case the aperture 60 has a circular cross-section). Preferably, the optical axis O extends centrally through the aperture 60, however, this is not essential.

Debris (excluding micro-particles) that may be generated by the radiation source SO may be considered to consist of plasma (interactive ions and electrons), ions (non interactive ions), and neutral particles (so-called "neutrals"). In order to mitigate the debris and substantially to prevent the debris from collecting on a reflective surface or mirror of the collector, a debris mitigation system 200 may be provided. The debris mitigation system may include a magnetic field generator that is constructed and arranged to generate a magnetic field in the vicinity of the radiation source SO and collector 70.

Figure 6:
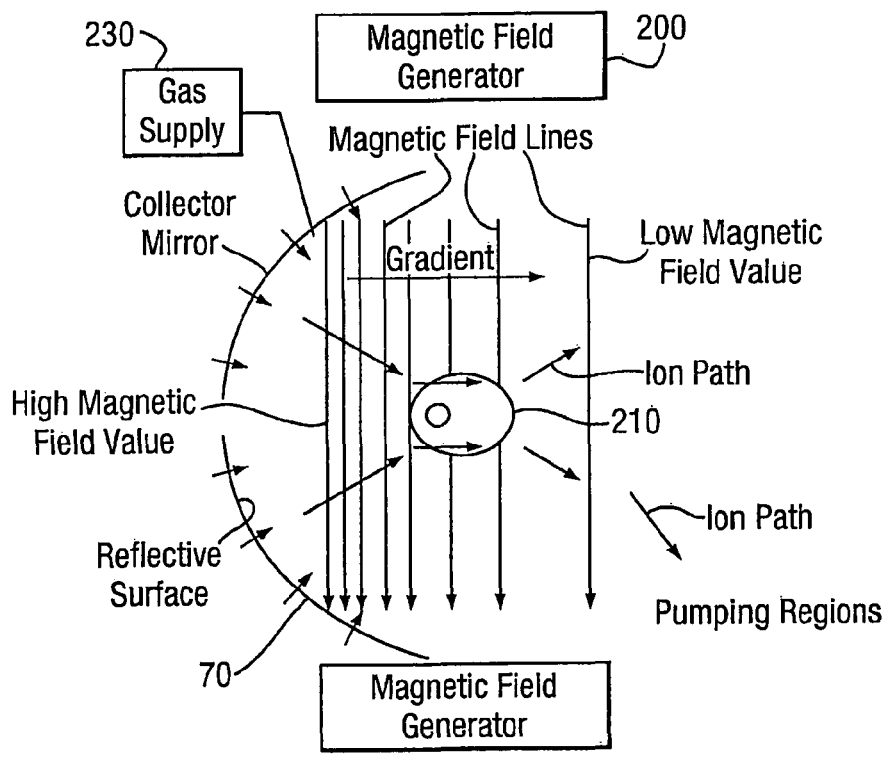
FIG. 6 depicts a radiation source and a normal incidence collector in accordance with an embodiment of the invention.

As illustrated in FIG. 6, plasma 210 generated by the radiation source can be deviated away from the reflective surface 70 of the collector (e.g., ML mirror) by a gradient of a magnetic field into the direction of a low magnetic field. In the embodiment illustrated in FIGS. 5, 6 and 7 a magnetic field that is generated by a magnetic field generator has a high magnetic value (i.e. is stronger) near the reflective surface of the collector side of the collector mirror, and a lower magnetic value (i.e. is weaker) away from the collector such that there is a gradient formed within the magnetic field. This is illustrated by the separation of magnetic field lines 220 in the Figures. These are further apart further away from the collector 70. That is, the value of the magnetic field is higher adjacent the collector than further away from said collector. By having a magnetic field stronger near the collector and weaker at a distance away from the collector, the magnetic field generator is configured to direct the plasma with at least a component in a direction parallel to a central optical axis of the radiation collector away from the collector. Preferably, as is illustrated, the plasma is directed substantially parallel to the central optical axis in a direction away from the radiation collector. It is a property of plasma (a collection of electrons and ions which interact with each other) that it will tend to move towards a lower magnetic field. Therefore another way of considering the magnetic field generator of the present invention is that it is configured to generate a magnetic field of different strengths on each side of the plasma. The magnetic field strength is stronger between the plasma and the radiation collector than on other sides of the plasma (i.e. those sides further from the radiation collector).

Figure 7:
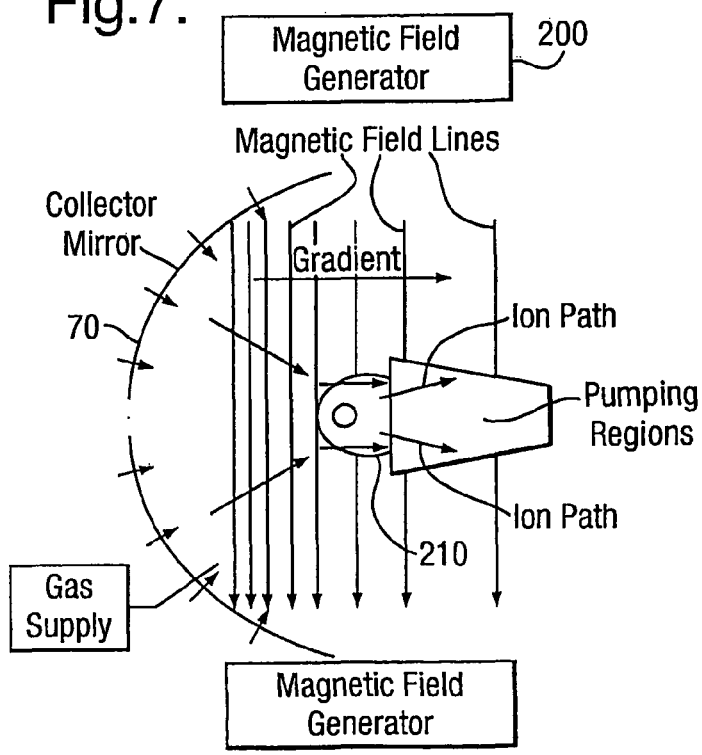
FIG. 7 depicts a radiation source and a normal incidence collector in accordance with an embodiment of the invention.

A gas supply 230 may be configured to supply a gas, such as hydrogen ($H_2$) or deuterium ($D_2$) or helium (He) into the magnetic field 220 i.e. into the volume where the plasma is generated (the chamber 3), as shown in FIGS. 6 and 7. The gas may interact with the plasma 210. Because the gas has a mass, a deviation flow of the plasma 210 (i.e. the movement of plasma away from the collector due to the magnetic gradient) may be slowed down, but may not be stopped. The gas supply may be configured to supply gas such that in the volume where the plasma is generated the gas has a pressure of greater than 10 Pa, 30 Pa, or 50 Pa, desirably greater than 75 Pa or greater than 100 Pa.

Because the plasma 210 will flow away from the portion of the magnetic field 220 that has a higher magnetic force, the magnetic field may be considered to be a pump i.e. a magnetic pump (FIG. 7). This works in the following way. As the plasma moves away from the collector, a vacuum is left behind it. The gas from the gas supply moves to fill that vacuum. In this way a flow of gas is generated by the magnetic field in a direction away from the collector. Any debris trapped in the gas is also pumped away by this flow. The gas can trap both neutral particles (for example tin) as well as positively charged ions (such as tin ions). Neutral particles are unaffected by the magnetic field whereas charged particles will be effected by the magnetic field and will travel along the magnetic flux lines or magnetic field lines in a direction substantially perpendicular to the optical axis of the collector.

Where tin is used as the fuel in the source, tin (Sn) ions may interact with the gas being supplied by the gas supply, and the gas may interact with tin neutral particles and other particles that are being pumped away. Although neutral particles do not interact with a magnetic field, the gas being provided by the gas supply may interact with the neutral particles and add mass to the neutral particles so that even the neutral particles may be pumped away. In an embodiment, the tin neutral particles may be ionized so that they may be influenced by the magnetic field. By utilizing a gas, such as hydrogen, with the magnetic field, even the tin neutrals may be magnetically pumped away.

Figure 8:
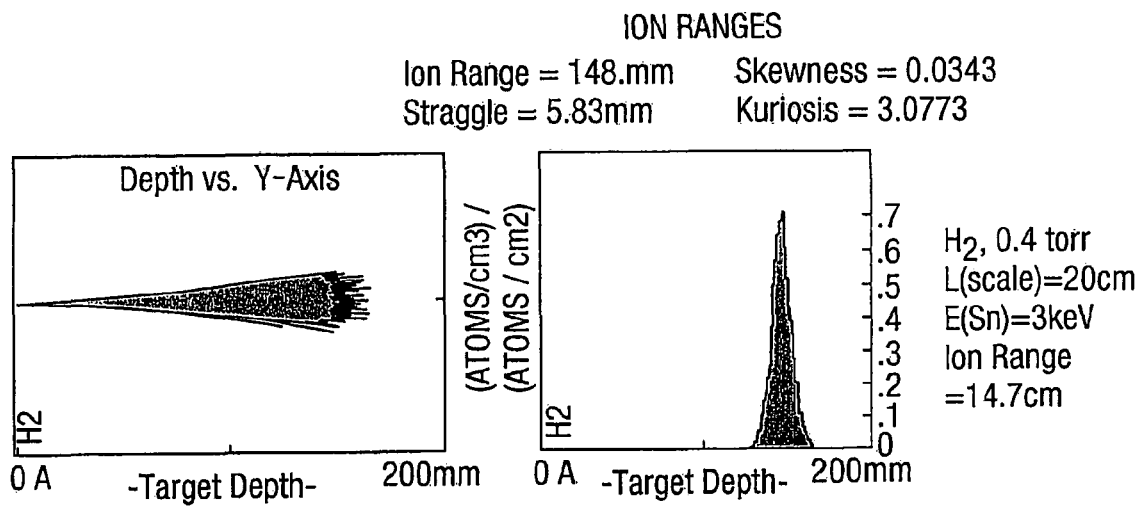
FIG. 8 depicts two graphs illustrating stopping lengths for ions in a radiation system according to an embodiment of the invention.

As neutral tin particles move away from the plasma (in every direction), they collide with hydrogen atoms. The hydrogen atoms are much lighter than the tin particles (atoms) so that the tin atoms are not deviated from their course. However, energy is taken out of the tin particles so that they slow down. FIG. 8 shows how the path of an ion will be deviated when passing through hydrogen. The result for neutral particles is likely to be similar. Therefore, the presence of hydrogen means that neutral particles will slow down in their trajectory away from the plasma. The neutral particles will slow down enough so that they are effected by the flow of gas caused by the magnetic pump. Thereby the neutral particles will be pumped away in the hydrogen gas behind the plasma.

With regard to ions which have escaped the plasma, these will spiral around magnetic field lines in a direction substantially perpendicular to the optical axis of the collector. However, these ions will also be slowed down by collisions with hydrogen atoms. Because the particles are spiraling around the magnetic field lines, they will be slowed down in a distance from the plasma much shorter than if they had a straight trajectory. Thereby the ions are slowed down and, like neutral particles, can be carried away with the gas being pumped by the magnetic pump. The invention can be seen as using EUV plasma (and its energy) for acceleration of plasma in needed direction for disposal of plasma and debris in gradient of magnetic field, which causes motion of surrounding gas in this direction, thus creating pumping effect and removing the debris from EUV source region.

Electrons may also be present. The electrons will be attracted to the plasma (which has a positive charge) and will thereby tend also to be removed away from the collector in a direction substantially parallel to the optical axis when they follow the plasma away from the collector as it is being moved due to the magnetic gradient. However, this is not very important because the electrons generally have too small an energy to damage components.

The magnetic pressure, which is being produced by the magnetic field may be calculated as $B^2/2\mu_o$ where B is the magnetic field strength and $\mu_o$ is the relative permeability. For comparison, a magnetic field of about 1 T may generate a magnetic pressure of about 4 bars that act on the plasma. This pressure is much higher than the pressure of the gas being supplied to the volume and may be the main driver for plasma restriction.

In addition, due to the gradient magnetic field, a bubble that constitutes the plasma constricted in the magnetic field may be moved to the lower magnetic field direction, thereby leaving an empty space behind itself and thus any gas being supplied to the system may be sucked into this empty space with sonic velocity (i.e. the magnetic pump). This may help stop the rest of the tin from a previous shot, and particles that are not influenced by the magnetic field due to the recharging in the gas or the neutrals. The plasma clouds that expand and move in the magnetic field gradient, which contain Sn and gas, (e.g., $H_2$ or $D_2$ or He) ions, may create a region of gas with decreased pressure behind the droplet, as the plasma cloud passes, thereby forming a gas flow in the region that has a velocity of the order of sonic. A vortex-like gas may follow.

The size of the plasma region may be represented by a formula such as:

$$P_{magnetic} * V^{(\gamma-1)} = E_{pulse}$$

where $P_{magnetic}$ is pressure, V is the volume of gas, $\gamma$ is the adiabatic constant and $E_{pulse}$ is the energy of the pulse. For example, for 1 T and 0.1 J pulse, the size of the contained bubble would be about 1.5 mm. A larger bubble that is ten times the size may also work, which means that the magnetic field that is still useful may be 30× smaller (and not necessarily a superconductive magnet).

Once a large amount of plasma is pumped out, a certain amount of ions that remain will not constitute plasma anymore and can thus be considered to be just ions. Without gas in the magnetic field, the ions may circle within the magnetic field and move along the magnetic field lines. If the magnetic field lines are away from the reflective surface of the collector then the path of the ions may be deviated from the reflective surface. If a gas is introduced while the ions are moving along the magnetic field lines, the ions may interact with the gas and be decelerated and pumped out as described above.

In an embodiment where the gas is a so-called "heavy" gas, such as argon (Ar), the ions may scatter and after every collision may go away from the magnetic field lines in random directions, which means the ions may diffuse perpendicular to the magnetic field to the mirror. Thus, the effects of the magnetic field and the gas being supplied to the collector may not multiply but may actually be counterproductive. This is the reason that hydrogen or deuterium are preferred as gases.

In an embodiment where the gas is a so-called "light" gas, such as hydrogen ($H_2$), deuterium ($D_2$) or Helium (He), the ions may not be scattered as much but may be decelerated. The ions may continue to move along the magnetic field lines and decelerate along them until the ions become slow and can then be pumped away by the flow of gas. Due to the fact that the trajectory along the magnetic field is longer than the trajectory without the magnetic field (because the ions are spiraling around the magnetic field lines), the efficiency of stopping the ion may be higher.

FIG. 8 illustrates the stopping length for 3 kEV ions in $H_2$ at 52 Pa. At 100 Pa, the stopping length is expected to be less than 5 cm. Thus, elongating the path of travel for the ions (by spiraling them along the magnetic field lines) may prove an improvement for ion suppression. Altogether, the expected effect for plasma may be 10000-100000×, and an additional 10× for ions. It is expected that for a higher hydrogen pressure ions present will have a lower energy (due to increased collisions) without much scattering.

Figure 9:
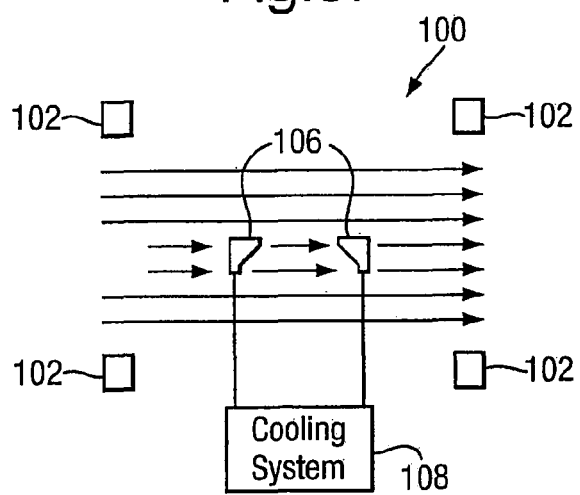
FIG. 9 depicts a magnetic field generator according to an embodiment of the invention.
Figure 10:
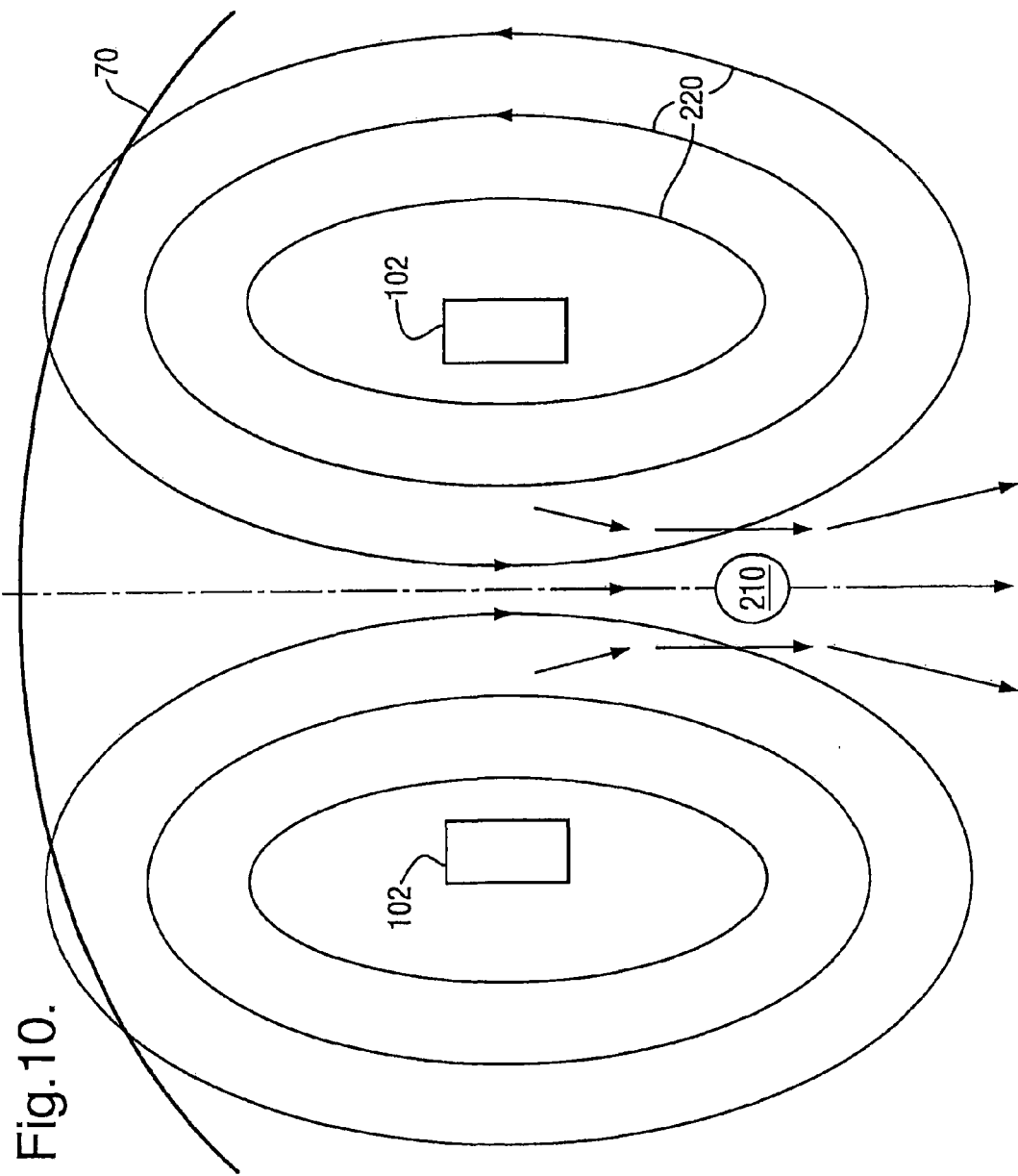
FIG. 10 depicts a radiation source and a normal incidence collector in accordance with a further embodiment of the invention.

FIG. 9 illustrates an embodiment of a magnetic field generator 100 according to an embodiment of the invention. As illustrated, the magnetic field generator comprises a plurality of coils 102 and a ferromagnetic material 106 located between the coils. The ferromagnetic material 106 may be configured to create a gradient within the magnetic field. The ferromagnetic material 106 may be a tube, for example a steel cone or it may be two pieces of metal in a yoke. The lines in FIG. 10 represent the field lines generated by the coils 102. Although only two coils are shown in cross-section, additional coils may be used. Because the magnetic properties of the ferromagnetic material 106 may deteriorate when heated, a cooling system 108 may be provided. The cooling system 108 may be constructed and arranged to cool the ferromagnetic material 106 so that the magnetic properties of the ferromagnetic material 106 may remain substantially unchanged even when exposed to radiation.

As will be apparent, other magnetic fields than those illustrated in FIGS. 5-7 could be used to direct the plasma 210 away from the collector 70. If the magnetic field is stronger at a position between the plasma and the collector than on other sides of the plasma, this would have the same effect. For example, in such an arrangement the magnetic field may actually be not that strong at the collector 70. One embodiment is illustrated in FIG. 10. Here a strong magnetic field is generated on a side of the plasma which is closer to the collector than other sides of the plasma on which sides the magnetic field is weaker. In the embodiment of FIG. 10 the plasma will again move generally in a direction parallel to a central optical axis of the radiation collector. However, this is not necessarily always the case.

The embodiment of FIGS. 5-7 have a magnetic field strength gradient which is perpendicular to the magnetic field lines. However, it is also possible to vary the magnetic field strength in a direction parallel to the magnetic field lines. Such a system may be easier to implement and more effective because the plasma moves easily along the magnetic field lines. In the other case, some instability can be generated in the plasma as it moves perpendicular to the magnetic field lines.

According to an embodiment of the present invention, there is provided a radiation system configured to generate a radiation beam. The radiation system includes a radiation source configured to generate a plasma that emits radiation and debris, and a radiation collector that includes a reflective surface configured to collect the radiation generated by the source and to direct the collected radiation to a radiation beam emission aperture. A gas supply is configured to supply a gas to a volume that includes the plasma, and a magnetic field generator is configured to generate a magnetic field to direct the debris away from the reflective surface of the radiation collector.

According to an embodiment of the present invention, there is provided a method for suppressing debris in a radiation system. The radiation system includes a radiation source and a radiation collector. The method includes supplying a gas to interact with debris particles generated with radiation produced by the radiation source, and generating a magnetic field within the radiation system to direct the debris particles away from a reflective surface of the radiation collector.

According to an embodiment of the present invention, there is provided a method for generating radiation with a radiation system. The radiation system includes a radiation source and a collector. The method includes generating a plasma with the radiation source, the plasma emitting the radiation and debris particles, and collecting the radiation with the collector and directing the collected radiation to a radiation beam emission aperture. The method also includes supplying a gas to interact with the debris particles, and generating a magnetic field within the radiation system to direct the debris particles away from a reflective surface of the collector.

According to an embodiment of the present invention, there is provided a lithographic apparatus that includes a radiation system configured to generate a radiation beam. The radiation system includes a radiation source configured to generate a plasma that emits radiation and debris, and a radiation collector that includes a reflective surface configured to collect the radiation generated by the source and to direct the collected radiation to a radiation beam emission aperture. A gas supply is configured to supply a gas to a volume comprising the plasma, and a magnetic field generator is configured to generate a magnetic field to direct the debris away from the reflective surface of the radiation collector. The apparatus also includes an illumination system constructed and arranged to receive the collected radiation from the radiation beam emission aperture and to condition the collected radiation into a radiation beam, and a support constructed and arranged to support a patterning device. The patterning device is configured to impart a pattern to a cross-section of the radiation beam to form a patterned radiation beam. The apparatus also includes a projection system constructed and arranged to project the patterned radiation beam onto a substrate.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc.

Although specific reference may have been made above to the use of embodiments of the invention in the context of optical lithography, it will be appreciated that the invention may be used in other applications, for example imprint lithography, and where the context allows, is not limited to optical lithography.

The terms "radiation" and "beam" used herein encompass all types of electromagnetic radiation, including ultraviolet (UV) radiation (e.g. having a wavelength of or about 365, 355, 248, 193, 157 or 126 nm) and extreme ultra-violet (EUV) radiation (e.g. having a wavelength in the range of 5-20 nm), as well as particle beams, such as ion beams or electron beams.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

It is to be understood that in the present application, the term "including" does not exclude other elements or steps. Also, each of the terms "a" and "an" does not exclude a plurality. Any reference sign(s) in the claims shall not be construed as limiting the scope of the claims.

What is claimed is:

1. A radiation system configured to generate a radiation beam, the radiation system comprising:
   a radiation source configured to generate a plasma that emits radiation and debris;
   a radiation collector to direct collected radiation to a radiation beam emission aperture;
   a magnetic field generator configured to generate a magnetic field with a gradient in magnetic field strength to move the plasma away from the radiation collector, wherein the magnetic field is stronger at a position between the plasma and the collector than on other sides of the plasma; and
   a gas supply configured to supply a gas to a volume comprising the plasma, wherein said gas supply is configured to supply gas such that gas in said volume has a pressure of greater than 10 Pa, and
   wherein said gas supply and magnetic field generator act as a magnetic pump configured to generate a flow of the gas in a direction away from the radiation collector and direct neutral particles of said debris away from the collector.

2. The radiation system according to claim 1, wherein the magnetic field generator is configured to move the plasma with at least a component in a direction parallel to a central optical axis of said radiation collector.

3. The radiation system according to claim 1, wherein the radiation collector comprises a reflective surface configured to collect the radiation generated by the source and the magnetic field generator is configured to direct the debris away from said reflective surface.

4. The radiation system according to claim 1, wherein the gas comprises hydrogen and/or deuterium and/or helium.

5. The radiation system according to claim 4, wherein the gas consists essentially of hydrogen or deuterium.

6. The radiation system according to claim 1, wherein said gas in said volume has a pressure of greater than 30 Pa.

7. The radiation system according to claim 1, wherein said gas supply is configured to decelerate debris in the form of charged ions in the magnetic field so that they are then removed by the magnetic pump.

8. The radiation system according to claim 1, wherein the radiation comprises extreme ultraviolet radiation.

9. The radiation system according to claim 1, wherein the radiation source is a laser produced plasma source.

10. The radiation system according to claim 9, wherein the radiation source comprises a laser constructed and arranged to provide a laser beam directed to a droplet of fuel.

11. The radiation system according to claim 10, wherein the fuel comprises Sn.

12. The radiation system according to claim 1, wherein the magnetic field is configured to substantially prevent the plasma from coming into contact with components of the radiation collector.

13. The radiation system according to claim 1, wherein the magnetic field generator comprises a plurality of coils constructed and arranged to generate the magnetic field.

14. The radiation system according to claim 13, wherein the magnetic field generator further comprise a ferromagnetic material between the coils, the ferromagnetic material being constructed and arranged to create a gradient within the magnetic field.

15. The radiation system according to claim 1, wherein the magnetic field generator comprises a ferromagnetic tube for making said magnetic field stronger between the plasma and the collector than on other sides of the plasma.

16. The radiation system according to claim 15, further comprising a cooling system to cool said ferromagnetic tube.

17. A method for suppressing debris in a radiation system, the radiation system comprising a radiation source and a radiation collector, the method comprising:
generating a plasma that emits radiation and debris;
collecting the radiation using the radiation collector;
generating a magnetic field gradient within the radiation system with a magnetic field generator to move the plasma away from the radiation collector, wherein the magnetic field is stronger at a position between the plasma and the collector than on other sides of the plasma; and
supplying a gas to a volume containing the plasma with a gas supply to interact with debris particles generated, wherein said gas in said volume has a pressure of greater than 10 Pa, and
wherein said gas supply and magnetic field generator act as a magnetic pump configured to generate a flow of the gas in a direction away from the radiation collector and direct neutral particles of said debris away from the collector.

18. The method according to claim 17, wherein the magnetic field generator moves the plasma with at least a component in a direction parallel to a central optical axis of the radiation collector.

19. The method according to claim 17, wherein the gas comprises hydrogen and/or deuterium and/or helium.

20. The method according to claim 17, wherein the gas consists essentially of hydrogen and/or deuterium and/or helium.

21. The method according to claim 17, wherein the variation in magnetic field strength is generated by a ferromagnetic material.

22. The method according to claim 21, further comprising cooling the ferromagnetic material.

23. The method according to claim 17, wherein the generating comprises directing a laser beam to a location of the radiation source while providing a fuel to the location so that at least part of the laser beam collides with the fuel to generate the plasma.

24. The method according to claim 23, wherein the fuel comprises Sn.

25. The method according to claim 17, further comprising substantially preventing the plasma from coming into contact with components of the radiation collector using the magnetic field.

26. A lithographic apparatus comprising:
a radiation system configured to generate a radiation beam, the radiation system comprising:
a radiation source configured to generate a plasma that emits radiation and debris,
a radiation collector to direct collected radiation to a radiation beam emission aperture,
a magnetic field generator configured to generate a magnetic field gradient to move the plasma away from the radiation collector, wherein the magnetic field is stronger at a position between the plasma and the collector than on other sides of the plasma, and
a gas supply configured to supply a gas to a volume comprising the plasma, wherein said gas supply is configured to supply gas such that gas in said volume has a pressure of greater than 10 Pa, and
wherein said gas supply and magnetic field generator act as a magnetic pump configured to generate a flow of the as in a direction away from the radiation collector and direct neutral particles of said debris away from the collector;
an illumination system constructed and arranged to receive the collected radiation from the radiation beam emission aperture and to condition the collected radiation into a radiation beam;
a support constructed and arranged to support a patterning device, the patterning device being configured to impart a pattern to a cross-section of the radiation beam to form a patterned radiation beam; and
a projection system constructed and arranged to project the patterned radiation beam onto a substrate.

27. The lithographic apparatus according to claim 26, wherein the magnetic field generator is configured to move the plasma with at least a component in a direction parallel to a central optical axis of said radiation collector.

28. The lithographic apparatus according to claim 26, wherein the radiation collector comprises a reflective surface configured to collect the radiation generated by the source and the magnetic field generator is configured to direct the debris away from said reflective surface.

29. The lithographic apparatus according to claim 26, wherein the gas comprises hydrogen and/or deuterium and/or helium.

30. The lithographic apparatus according to claim 26, wherein the gas consists essentially of hydrogen.

31. The lithographic apparatus according to claim 26, wherein said gas in said volume has a pressure of greater than 30 Pa.

32. The lithographic apparatus according to claim 26, wherein said gas supply is configured to decelerate debris in the form of charged ions in the magnetic field so that they are then removed by the magnetic pump.

33. The lithographic apparatus according to claim 26, wherein the radiation comprises extreme ultraviolet radiation.

34. The lithographic apparatus according to claim 26, wherein the radiation source is a laser produced plasma source.

35. The lithographic apparatus according to claim 34, wherein the radiation source comprises a laser constructed and arranged to provide a laser beam directed to a droplet of fuel.

36. The lithographic apparatus according to claim 35, wherein the fuel comprises Sn.

37. The lithographic apparatus according to claim 26, wherein the magnetic field is configured substantially to prevent the plasma from coming into contact with components of the radiation collector.

38. The lithographic apparatus according to claim 26, wherein the magnetic field generator comprises a plurality of coils constructed and arranged to generate the magnetic field.

39. The lithographic apparatus according to claim 38, wherein the magnetic field generator further comprise a ferromagnetic material between the coils, the ferromagnetic material being constructed and arranged to create a gradient within the magnetic field.

40. The lithographic apparatus according to claim 26, wherein the magnetic field generator comprises a ferromagnetic tube for making said magnetic field stronger between the plasma and the collector than on other sides of the plasma.

41. The lithographic apparatus according to claim 40, further comprising a cooling system constructed and arranged to cool the ferromagnetic material.

* * * * *